United States Patent [19]

Toyama

[11] Patent Number: 4,569,700
[45] Date of Patent: Feb. 11, 1986

[54] METHOD OF MANUFACTURING A STACKED SEMICONDUCTOR DEVICE

[75] Inventor: Masaharu Toyama, Yokohama, Japan

[73] Assignee: Tokyo Shibaura Denki Kabushiki Kaisha, Kawasaki, Japan

[21] Appl. No.: 750,245

[22] Filed: Jul. 1, 1985

Related U.S. Application Data

[63] Continuation of Ser. No. 421,097, Sep. 22, 1982, abandoned.

[30] Foreign Application Priority Data

Sep. 25, 1981 [JP] Japan ................................ 56-151484

[51] Int. Cl.⁴ ............................................ H01L 21/365
[52] U.S. Cl. ...................................... 148/174; 148/175; 29/576 E; 29/576 J
[58] Field of Search .............. 148/174, 175; 29/576 E, 29/576 J

[56] References Cited

U.S. PATENT DOCUMENTS 4,270,960 6/1981 Bollen et al. ................ 148/174 X
4,319,954 3/1982 White et al. ................. 148/DIG. 1
4,323,417 4/1982 Lam ............................ 156/613
4,498,951 2/1985 Tamura et al. .............. 148/175 X
4,523,962 6/1985 Nishimura ................... 148/1.5

FOREIGN PATENT DOCUMENTS 0020135 12/1980 European Pat. Off. .
1589705 4/1970 Fed. Rep. of Germany .
2832012 1/1980 Fed. Rep. of Germany .
1417088 9/1965 France .

OTHER PUBLICATIONS

IBM Technical Disclosure Bulletin, vol. 22, No. 12, May 1980, pp. 5484–5485, Armonk, US, C. Chang et al.: "Multilayered Integrated Structures".

Primary Examiner—George T. Ozaki
Attorney, Agent, or Firm—Oblon, Fisher, Spivak, McClelland & Maier

[57] ABSTRACT

The invention provides a stacked semiconductor device having a plurality of monocrystalline semiconductor films of the same material which are formed on a monocrystalline semiconductor substrate and between which insulating films are sandwiched wherein the semiconductor device comprises at least one connecting region, and wherein the semiconductor substrate and the semiconductor films are vertically connected at the one connecting region.

10 Claims, 27 Drawing Figures

METHOD OF MANUFACTURING A STACKED SEMICONDUCTOR DEVICE

This application is a continuation of application Ser. No. 421,097 filed Sept. 22, 1982, now abandoned.

BACKGROUND OF THE INVENTION

The present invention relates to a stacked semiconductor device which comprises a plurality of stacked monocrystalline semiconductor films each of which has a plurality of semiconductor elements.

Such a stacked semiconductor device wherein the plurality of stacked monocrystalline semiconductor films of the same material between which insulating layers are sandwiched is very promising as a photo semiconductor device and as a three-dimensional integrated circuit.

FIG. 1 is a sectional view of a conventional stacked semiconductor device. Referring to FIG. 1, reference numeral 10 denotes a monocrystalline semiconductor substrate; and 11a, 11b and 11c, first, second and third monocrystalline semiconductor films. Reference numerals 12a, 12b and 12c denote insulating films respectively between the semiconductor substrate 10 and the first semiconductor film 11a, between the first and second monocrystalline semiconductor films 11a and 11b, and between the second and third monocrystalline semiconductor films 11b and 11c. Reference numerals 13a, 13b and 13c denote connecting regions respectively between the semiconductor substrate 10 and the first monocrystalline semiconductor film 11a, between the first and second monocrystalline semiconductor films 11a and 11b, between the second and third monocrystalline semiconductor films 11b and 11c. Reference numerals 14a, 14b and 14c denote first, second and third isolating layers respectively formed in the first, second and third monocrystalline semiconductor films.

FIGS. 2A to 2E are sectional views for explaining the steps of manufacturing the stacked semiconductor device shown in FIG. 1. The semiconductor elements formed in the monocrystalline semiconductor substrate and the monocrystalline semiconductor films throughout FIGS. 1 to 9F are not directly related to the present invention, so that the description and illustration thereof will be omitted for descriptive convenience.

Referring to FIG. 2A, the first insulating film 12a is deposited on the semiconductor substrate 10 except for the connecting region 13a. As shown in FIG. 2B, a polycrystalline or amorphous semiconductor film is deposited on the first insulating film 12a. Thereafter, annealing such as laser annealing is performed to grow single crystals using the connecting region 13a as a seed crystal. As a result, the first monocrystalline semiconductor film 11a is formed.

As shown in FIG. 2C, the second insulating film 12b is then deposited on the first monocrystalline semiconductor film 11a except for the connecting region 13b. As shown in FIG. 2D, a polycrystalline or amorphous semiconductor film is deposited to cover the entire surface. Thus, in the same manner as the first monocrystalline semiconductor film 11a, the second monocrystalline semiconductor film 11b is obtained. Similarly, as shown in FIG. 2E, the third insulating film 12C is deposited on the second monocrystalline semiconductor film 11b except for the third connecting region 13c. The third monocrystalline semiconductor film 11c is then formed to obtain the structure shown in FIG. 1.

In the conventional method for manufacturing the stacked semiconductor device and the thus obtained semiconductor device, the following drawbacks are presented. It is important to convert the polycrystalline or amorphous semiconductor film to a monocrystalline semiconductor film using part of the semiconductor substrate or part of the underlying monocrystalline semiconductor film as a seed crystal. However, since the polycrystalline or amorphous semiconductor film is formed on the insulating layer, the above conversion is difficult to accomplish at a location which is apart from the seed crystal. In the conventional stacked semiconductor device, the position of the seed crystal has only been selected in accordance with the element or circuit configuration. For this reason, the first, second and third connecting regions 13a, 13b and 13c which are used as the seed crystals for forming the first, second and third monocrystalline semiconductor films 11a, 11b and 11c are spaced far apart from each other. When the number of monocrystalline semiconductor films to be stacked is increased, the distance for conversion into single crystals from the semiconductor substrate is increased from what is regarded as the initial seed crystal. Therefore, conversion into single crystals can hardly be achieved. In this condition, almost impossible control conditions of annealing or the like are required for conversion into single crystals. Furthermore, even if the stacked monocrystalline semiconductor structure is obtained by the above process, the crystal quality of the upper semiconductor films is greatly degraded. For example, the carrier mobility is greatly degraded.

SUMMARY OF THE INVENTION

It is, therefore, an object of the present invention to provide a stacked semiconductor device which has a plurality of stacked semiconductor films of high quality on a semiconductor substrate.

In order to achieve the above object of the present invention, there is provided a stacked semiconductor device having a plurality of monocrystalline semiconductor films of the same material which are formed on a monocrystalline semiconductor substrate. Insulating films are sandwiched between adjacent films. The semiconductor device includes at least one connecting region, and the semiconductor substrate and the semiconductor films are vertically connected at the at least one connecting region.

DETAILED DESCRIPTION OF THE PREFERRED EMBODIMENTS

In a stacked semiconductor device of the present invention, a plurality of monocrystalline semiconductor films are stacked on a semiconductor substrate and sandwich insulating films therebetween. The semiconductor substrate comprises, for example, an n-type or p-type semiconductor substrate, or the kind of semiconductor substrate or sapphire substrate on which a single-crystalline semiconductor layer is formed. The monocrystalline semiconductor films between which the insulating films are sandwiched are vertically connected at a connecting region. The connecting region may be used as a seed crystal for forming monocrystalline semiconductor films. Each monocrystalline semiconductor film is formed such that a polycrystalline or amorphous semiconductor film is deposited on the insulating film and annealing is then performed by means of a laser or electron beam using the connecting region as the seed crystal.

The number of the connecting regions need not be limited to one, but a plurality of connecting regions may be formed. In this case, all the monocrystalline semiconductor films need not be formed using the same connecting region as the seed crystal. A given semiconductor film may be formed to be a monocrystalline silicon film using a given connecting region as the seed crystal. Similarly, another given semiconductor film may be formed to be a monocrystalline silicon film using another given connecting region as the seed crystal.

According to the present invention, since conversion into single crystals can be performed using as the seed crystal part of the semiconductor substrate or any given single crystal which is adjacent thereto, a monocrystalline semiconductor film with high guality can be obtained. Therefore, the carrier mobility is not significantly decreased, thus providing a high-speed stacked semiconductor device.

Examples of the present invention will be described in detail.

EXAMPLE 1

Figure 1:
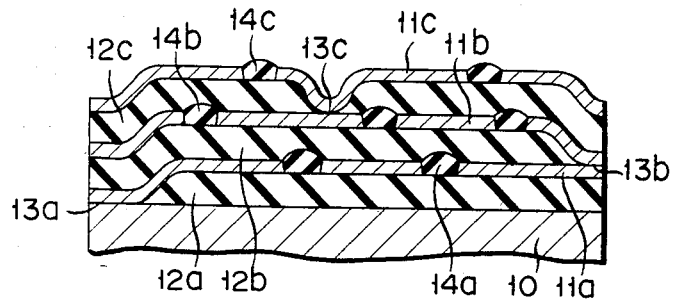
FIG. 1 is a sectional view of a conventional stacked semiconductor device.
Figure 2A:
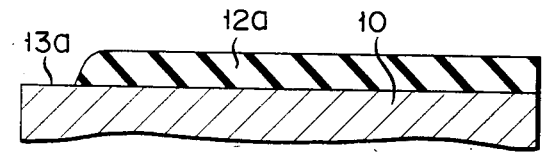
FIGS. 2A to 2E are sectional views for explaining the steps of manufacturing the stacked semiconductor device shown in FIG. 1.
Figure 2B:
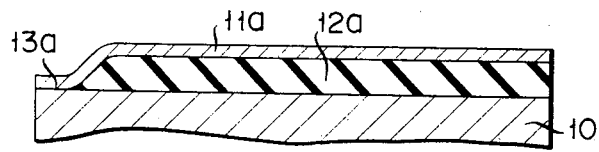
Figure 2C:
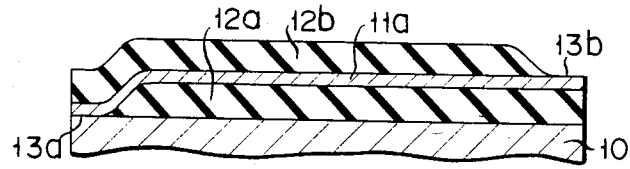
Figure 2D:
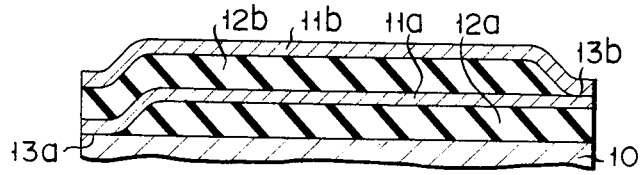
Figure 2E:
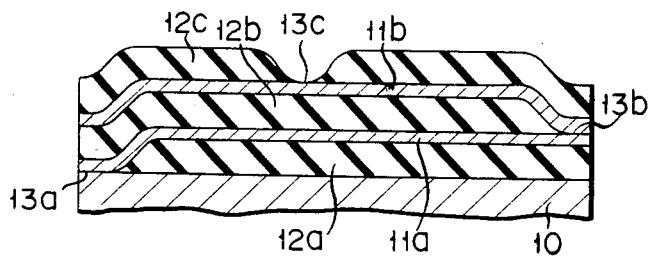
Figure 3:
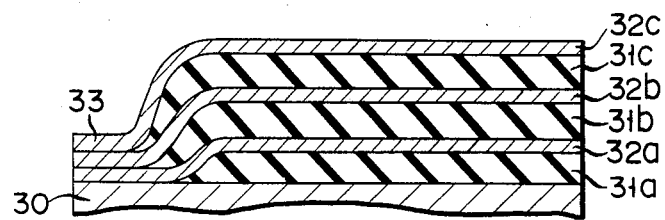
FIG. 3 is a sectional view of a stacked semiconductor device according to an embodiment of the present invention.

FIG. 3 is a sectional view of a stacked semiconductor device having the simplest structure among the embodiments of the present invention. Referring to FIG. 3, reference numeral 30 denotes a monocrystalline semiconductor substrate. Reference numerals 31a, 31b and 31c respectively denote first, second and third insulating films; 32a, 32b and 32c, respectively first, second and third monocrystalline semiconductor films; and 33, a connecting region for connecting the semiconductor substrate 30, the first monocrystalline semiconductor film 32a, the second monocrystalline semiconductor film 32b, and the third monocrystalline semiconductor film 32c. The connecting region 33 is used as a seed crystal portion when the monocrystalline semiconductor films 32a to 32c are formed. According to the stacked semiconductor device of the above structure, the first, second and third monocrystalline semiconductor films 32a, 32b and 32c are coupled to the semiconductor substrate 30 at the connecting region 33. Conversion into single crystals is performed by using the semiconductor substrate 30 or a monocrystalline semiconductor film portion which has high quality and which is closest to the semiconductor substrate 30 as the seed crystal. Therefore, the monocrystalline semiconductor films can be easily formed and have high quality.

FIGS. 4A to 4F are sectional views for explaining the stacked semiconductor device shown in FIG. 3.

Figure 4A:
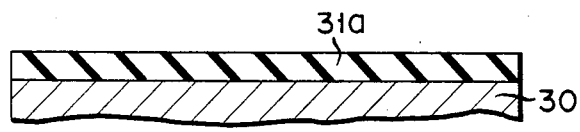
FIGS. 4A to 4F are sectional views for explaining the steps of manufacturing the stacked semiconductor device shown in FIG. 3.
Figure 4B:
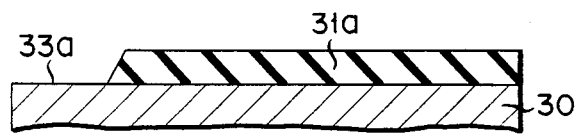
Figure 4C:
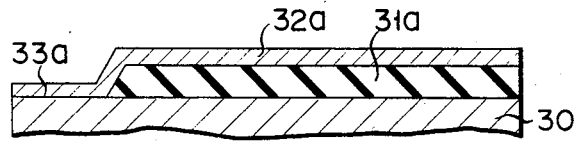
Figure 4D:
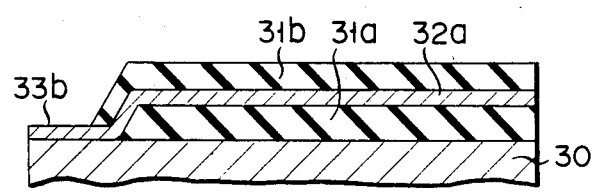
Figure 4E:
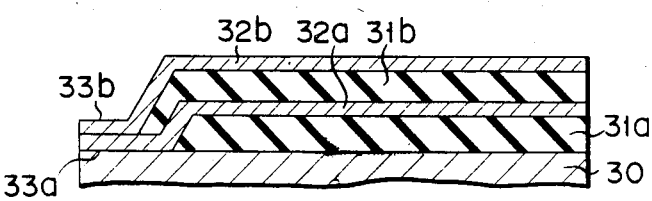
Figure 4F:
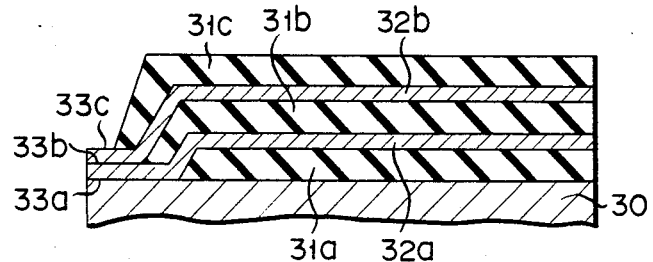

Referring to FIG. 4A, the monocrystalline semiconductor substrate 30 comprises silicon. After a desired element or circuit is formed on the substrate, the first insulating film 31a which comprises an SiO$_2$ film is formed thereon. As shown in FIG. 4B, part of the first insulating film 31a is etched to expose part of the semiconductor substrate as a first connecting region 33a. As shown in FIG. 4C, a polycrystalline or amorphous semiconductor film of the same material as that of the semiconductor substrate is deposited to cover the entire surface. Annealing is performed using the first connecting region 33a as the seed crystal. Thus, the first monocrystalline semiconductor film 32a is obtained. Thereafter, an element or circuit is formed on the first monocrystalline silicon film 32a. As shown in FIG. 4D, the second insulating film 31b is deposited to cover the first semiconductor film 32a, and a portion of the film 31b immediately on the first connecting region 33a is removed. An exposed portion of the film 32a is defined as a second connecting region 33b. As shown in FIG. 4E, a polycrystalline or amorphous semiconductor film is deposited and converted to a monocrystalline semiconductor film using the second connecting region 33b as the seed crystal. Thus, the second monocrystalline semiconductor film 32b is obtained. After an element or circuit is formed on the second monocrystalline semiconductor film 32b, the third insulating film 31c is deposited on the second semiconductor film 32b as shown in FIG. 4F. At the same time, a portion of the second semiconductor film 32b immediately on the second connecting region 33b is exposed to form a third connecting region 33c. In the same manner as described above, monocrystalline semiconductor films are formed.

In Example 1, if the connecting region 33 (33a, 33b, 33c) is formed around the IC chip, the region can be used as a scribing line since this portion is thin.

EXAMPLE 2

Figure 5:
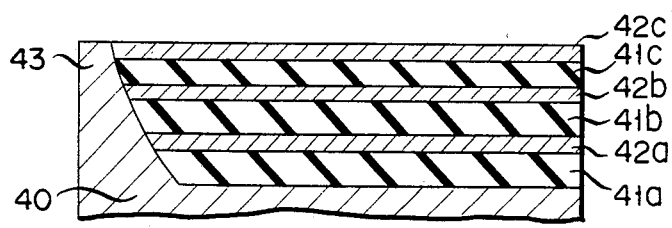
FIG. 5 is a sectional view of a stacked semiconductor device according to another embodiment of the present invention.

FIG. 5 is a sectional view of a stacked semiconductor device according to another embodiment of the present invention. Referring to FIG. 5, reference numeral 40 denotes a semiconductor substrate; 41a, 41b and 41c, first, second and third insulating films, respectively; 42a, 42b and 42c, first, second and third monocrystalline semiconductor films, respectively; and 43, a connecting region. In Example 2, the connecting region 43 is a projection which is part of a semiconductor substrate 40. The first, second and third monocrystalline semiconductor films 42a, 42b and 42c are formed using the connecting region 43 as a seed crystal. Therefore, the first, second and third monocrystalline semiconductor films 42a, 42b and 42c are directly in contact with the side surface of the connecting region 43.

FIGS. 6A to 6E are sectional views for explaining the steps of manufacturing a stacked integrated circuit shown in FIG. 5.

Figure 6A:
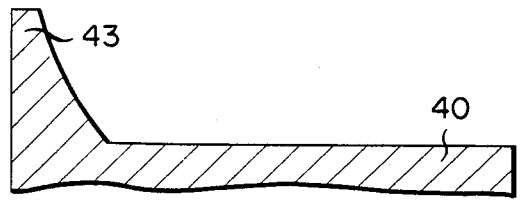
FIGS. 6A to 6E are sectional views for explaining the steps of manufacturing the stacked semiconductor device shown in FIG. 5.
Figure 6B:
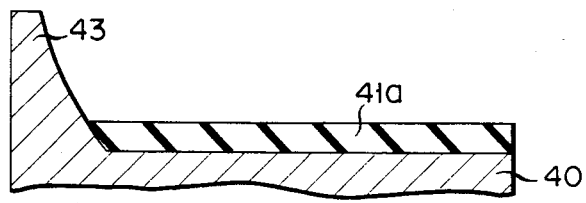
Figure 6C:
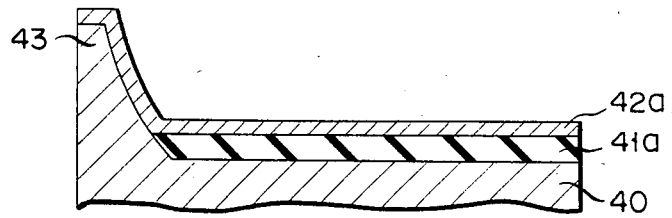
Figure 6D:
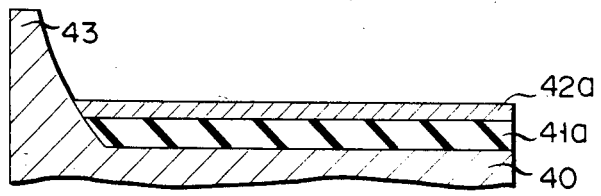
Figure 6E:
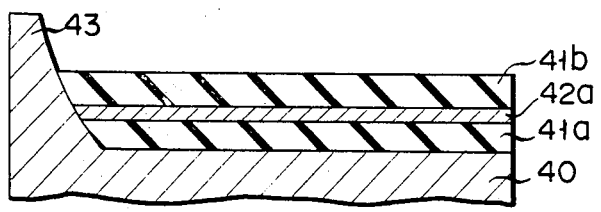

As shown in FIG. 6A, the monocrystalline semiconductor substrate 40 is etched deeply to leave the connecting region 43. A desired element or circuit is formed in a recess of the substrate. As shown in FIG. 6B, the first insulating film 41a is selectively deposited. Subsequently, as shown in FIG. 6C, a polycrystalline or amorphous semiconductor film is deposited to cover the entire surface. Annealing is performed starting from the portion of the polycrystalline or amorphous semiconductor film which contacts the connecting region 43, so that conversion into single crystal advances to form a monocrystalline semiconductor film. As shown in FIG. 6D, a portion of the monocrystalline semiconductor film is etched except for the flat portion thereof, so that the connecting region 43 is exposed. Thus, the first monocrystalline semiconductor film 42a is obtained. After a desired element or circuit is formed, the second insulating film 41b is selectively formed in the recess of the substrate, as shown in FIG. 6E. By repeating the process described above, a stacked semiconductor integrated circuit is prepared.

The height of the connecting region 43 and the depth of the recess of the substrate are preferably determined so as to obtain a flat surface as shown in FIG. 5 when the stacked semiconductor device is obtained. The position of the connecting region 43 may be in the periphery of the integrated circuit chip. Furthermore, since the structure provides a flat surface, it is convenient to use the connecting region 43 as part of the circuit (e.g., common ground line or a power source line required for the multi-layer.) Several connecting regions similar to the connecting region 43 can be formed in the IC chip as needed. In this case, the range of conversion into single crystals to be controlled by a single connecting region is narrow, a high yield of conversion into single crystals is achieved, and a highly reliable and high-performance semiconductor device can be obtained as a whole.

Figure 7:
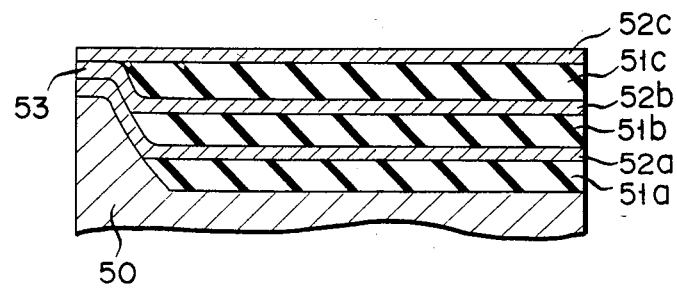
FIG. 7 is a sectional view of a stacked semiconductor device according to still another embodiment of the present invention.

Portions overlaid on the connecting region 43 are etched every time in this embodiment. However, if these portions are left, a structure as shown in FIG. 7 can be obtained. This structure is a combination of the structures shown in FIGS. 3 and 5. Referring to FIG. 7, reference numeral 50 denotes a monocrystalline semiconductor substrate; and 51a, 51b and 51c, first, second and third insulating films, respectively; and 52a, 52b and 52c, first, second and third monocrystalline semiconductor films. A connecting region 53 is formed on the projection of the semiconductor substrate 50.

EXAMPLE 3

Figure 8:
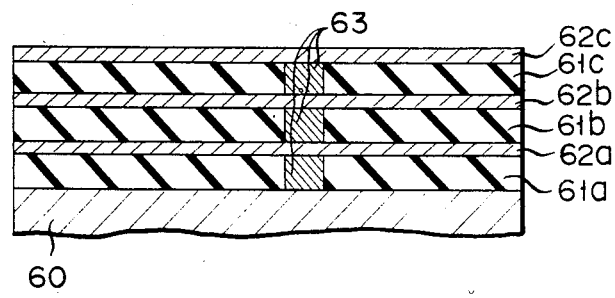
FIG. 8 is a sectional view of a stacked semiconductor device according to still another embodiment of the present invention.

FIG. 8 is a sectional view of a stacked semiconductor device according another embodiment of the present invention. Referring to FIG. 8, reference numeral 60 denotes a monocrystalline semiconductor substrate; 61a, 61b and 61c, first, second and third insulating films, respectively; 62a, 62b and 62c, first second and third monocrystalline semiconductor films, respectively; and 63, connecting regions which comprise a monocrystalline semiconductor. The connecting regions 63 are made of the same semiconductor material as that of the semiconductor substrate 60. The connecting regions 63 are used as the seed crystal for conversion into single crystals to form the first to third monocrystalline semiconductor films 62a to 62c.

FIGS. 9A to 9F are sectional views for explaining the steps of forming a stacked semiconductor device shown in FIG. 8.

Figure 9A:
FIGS. 9A to 9F are sectional views for explaining the steps of manufacturing the semiconductor device shown in FIG. 8.
Figure 9B:
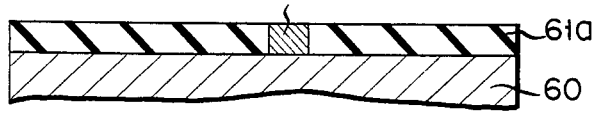
Figure 9C:
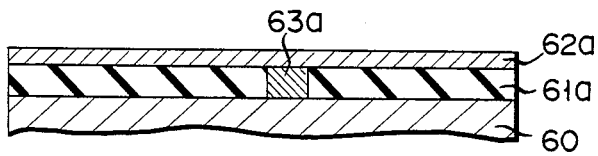
Figure 9D:
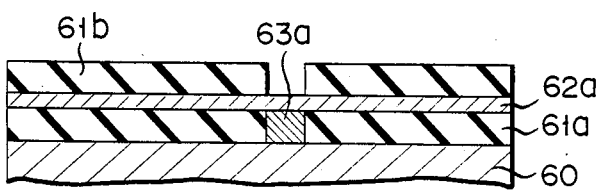
Figure 9E:
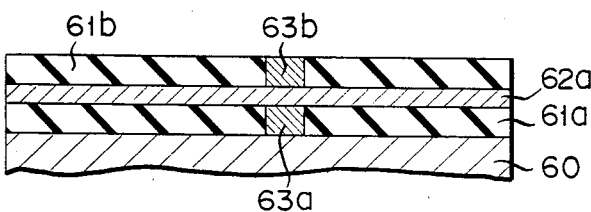
Figure 9F:
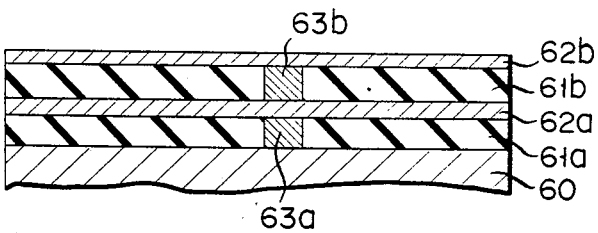

As shown in FIG. 9A, after a desired element or circuit is formed on the monocrystalline semiconductor substrate 60, the first insulating film 61a is formed thereon except for a prospective connecting region. As shown in FIG. 9B, a first connecting region 63a which is of the same material as that of the semiconductor substrate 60 is selectively grown as a seed crystal by the epitaxial growth method. Part of the semiconductor substrate 60 is virtually projected to a height corresponding to one cycle of layer formation. The upper surface of the grown layer is at the same level as that of the first insulating film 61a. As shown in FIG. 9C, a polycrystalline or amorphous semiconductor layer is deposited to cover the entire surface. Annealing is performed starting from the point where the polycrystalline or amorphous semiconductor film contacts the first connecting region 63a. The polycrystalline or amorphous semiconductor film is converted to a monocrystalline silicon film using the first connecting region 63a as the seed crystal. Thus, the first monocrystalline semiconductor film 62a is obtained. A desired element or circuit is formed on the first monocrystalline semiconductor film 62a. As shown in FIG. 9D, the second insulating film 61b is selectively deposited on the first monocrystalline semiconductor film 62a except for a portion immediately on the connecting region 63a. As shown in FIG. 9E, a second connecting region 63b which is of the same semiconductor material as that of the semiconductor substrate 60 is selectively formed by the epitaxial growth method. At this time, the upper surface of the grown film is at the same level as that of the second insulating film 61b. As shown in FIG. 9F, a polycrystalline or amorphous semiconductor film is deposited, and annealing is performed starting from a point where the polycrystalline or amorphous semiconductor film contacts the connecting region, so that the polycrystalline or amorphous semiconductor film is converted to a monocrystalline semiconductor film using the second connecting region 63b as seed crystal. Thus, the second monocrystalline semiconductor film 62b is obtained. By repeating the same process as described above, a stacked semiconductor device is prepared.

In Example 3, selective epitaxial growth is performed to form every connection region. In this case, the connecting regions are vertically connected from the semiconductor substrate to the layers formed thereon. The same effect as obtained in Examples 1 and 2 can be obtained in Example 3. A monocrystalline semiconductor film of high quality is produced with a high yield. Furthermore, the surface of each layer is made flat, and the connecting regions can be used as the common ground line or power source line.

According to Example 3, the connecting region is formed by the epitaxial growth method. However, each monocrystalline semiconductor layer may be formed relatively thick, and then selectively etched to leave a connecting region.

What is claimed is:

1. A method for manufacturing a stacked semiconductor device, comprising:
    forming a first non-mono-crystalline semiconductor film on a monocrystalline semiconductor substrate through a first insulating film;
    converting said first non-mono-crystalline semiconductor film into a first monocrystalline semiconductor film;

forming a second non-mono-crystalline semiconductor film on said first monocrystalline semiconductor film through a second insulating film; and converting said second non-mono-crystalline semiconductor film into a second monocrystalline film, wherein the conversion into the monocrystalline semiconductor film is performed by using as a seed crystal at least one connecting region at which said semiconductor substrate and said first and second monocrystalline semiconductor film are vertically connected.

2. A method according to claim 1 wherein said non-mono-crystalline semiconductor film consists of semiconductor material selected from the group consisting of amorphous semiconductor material and polycrystalline semiconductor material.

3. A method according to claim 1, wherein said conversion into the monocrystalline semiconductor film is performed by irradiation of a laser or electron beam.

4. A method according to claim 1 wherein said connecting region comprises parts of said semiconductor films which do not sandwich said insulating films therebetween.

5. A method according to claim 4, wherein said connecting region is a projection which is formed from part of said semiconductor substrate.

6. A method according to claim 5 wherein said of said semiconductor films is formed by conversion into single crystals using said projection as a seed crystal.

7. A method according to claim 4 wherein said connecting part is formed in a periphery of a semiconductor chip.

8. A method according to claim 1 wherein said connecting part comprises parts of said semiconductor films and portions of monocrystalline semiconductor materials sandwiched therebetween.

9. The method according to claim 8 wherein each of said semiconductor films is obtained by conversion into single crystals using as a seed crystal one of said portions of monocrystalline semiconductor material immediately below each of said semiconductor films.

10. A method according to claim 1 wherein said connecting part is used as one of a ground line and a power source line of an integrated circuit.

* * * * *